United States Patent
Lu et al.

(10) Patent No.: US 6,388,471 B1
(45) Date of Patent: May 14, 2002

(54) SINGLE PHASE EDGE TRIGGER REGISTER (75) Inventors: Wei-ping Lu, Saratoga; Tejvansh S. Soni, Fremont; Victor Shadan, Santa Clara; Edward Pak, Saratoga, all of CA (US); Yuan-ping Chen, Austin, TX (US)

(73) Assignee: SandCraft, Inc., Santa Clara, CA (US)

( * ) Notice: Subject to any disclaimer, the term of this patent is extended or adjusted under 35 U.S.C. 154(b) by 0 days.

(21) Appl. No.: 09/569,818

(22) Filed: May 12, 2000

(51) Int. Cl.$^7$ ............................................. H03K 19/096
(52) U.S. Cl. ........................... 326/98; 326/95; 326/112; 326/115
(58) Field of Search ............................ 326/93–98, 112, 326/115, 119

(56) References Cited

U.S. PATENT DOCUMENTS 5,148,061 A * 9/1992 Hsueh et al. ................ 307/475
6,014,041 A * 1/2000 Somaskhar et al. ......... 326/115
6,046,608 A * 4/2000 Theogarajan ................ 326/121

* cited by examiner

*Primary Examiner*—Michael Tokar
*Assistant Examiner*—Anh Q. Tran
(74) *Attorney, Agent, or Firm*—Blakely, Sokoloff, Taylor & Zafman LLP (57) ABSTRACT

A method and a device for maintaining logic state stored in a storage device are described. For one embodiment, the device precharges at least two complimentary nodes in a storage device during the precharge cycle. During the evaluation cycle, the device receives an input data. After receipt of the input data, device stores at least one logic state at a storage node according to the input data. The device includes at least one conducting path to limit one store per each evaluation stage.

31 Claims, 6 Drawing Sheets

SINGLE PHASE EDGE TRIGGER REGISTER

BACKGROUND OF THE INVENTION

1. Field of the Invention

The present invention relates to the field of integrated circuits and, more specifically, to logic circuits designed for high-speed operation, such as domino logic circuits.

2. Description of the Related Art

Performance goals of processors increase with every generation, and progressively more sophisticated architectures are required to implement their complex functions. Advanced architectures require long pipelines operating at very high frequencies. These higher frequencies demand increased usage of sophisticated circuit design styles like domino circuits.

Domino circuits, also known as dynamic circuit, increase the speed performance of logic circuits by reducing the capacitance associated with the use of P-type metal oxide semiconductors ("MOS"). Domino circuits accomplish this by precharging a series of logic gates during a first dock phase, or precharge cycle, and evaluating the intended logic function during the next clock phase, or evaluation cycle.

However, a problem with a typical domino circuit is that if the input data changes its value during the evaluation cycle after the node values are set, the voltage potential at the precharged node may float until the next precharge cycle. A node value is voltage potential at the node and is typically being set at the beginning of the evaluation cycle. The float or float node indicates the voltage potential at a node or node value is not being driven. Accordingly, a float may cause an unknown logic value at the node. Thus, the domino circuit may give a wrong value when a float node is being accessed during the evaluation cycle.

SUMMARY OF THE INVENTION

A method and a device for maintaining logic state stored in a storage device are described. For one embodiment, the device precharges at least two complimentary nodes in the storage device during the precharge cycle. During the evaluation cycle, the device receives an input data. After receipt of the input data, device stores at least one logic state in the storage device according to the input data. The device includes at least one conducting path to limit one store per each evaluation stage.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and a device for maintaining logic state stored in a storage device are disclosed.

For purposes of explanation, in the following description, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

Some portions of the detailed descriptions that follow are presented in terms of algorithms and symbolic representations of operations on data bits within a computer. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven to be convenient at times, principally for reasons of common usage, to refer to these signals as bits, values, elements, symbols, characters, terms, numbers, or the like.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

For one embodiment, a device precharges at least two complimentary nodes in a storage device during the precharge stage. During the evaluation stage, the device receives an input data. After receipt of the input data, device stores at least one logic state at a storage node according to the logic value of input data. The device includes at least one conducting path to limit one store per each evaluation stage.

Figure 1:
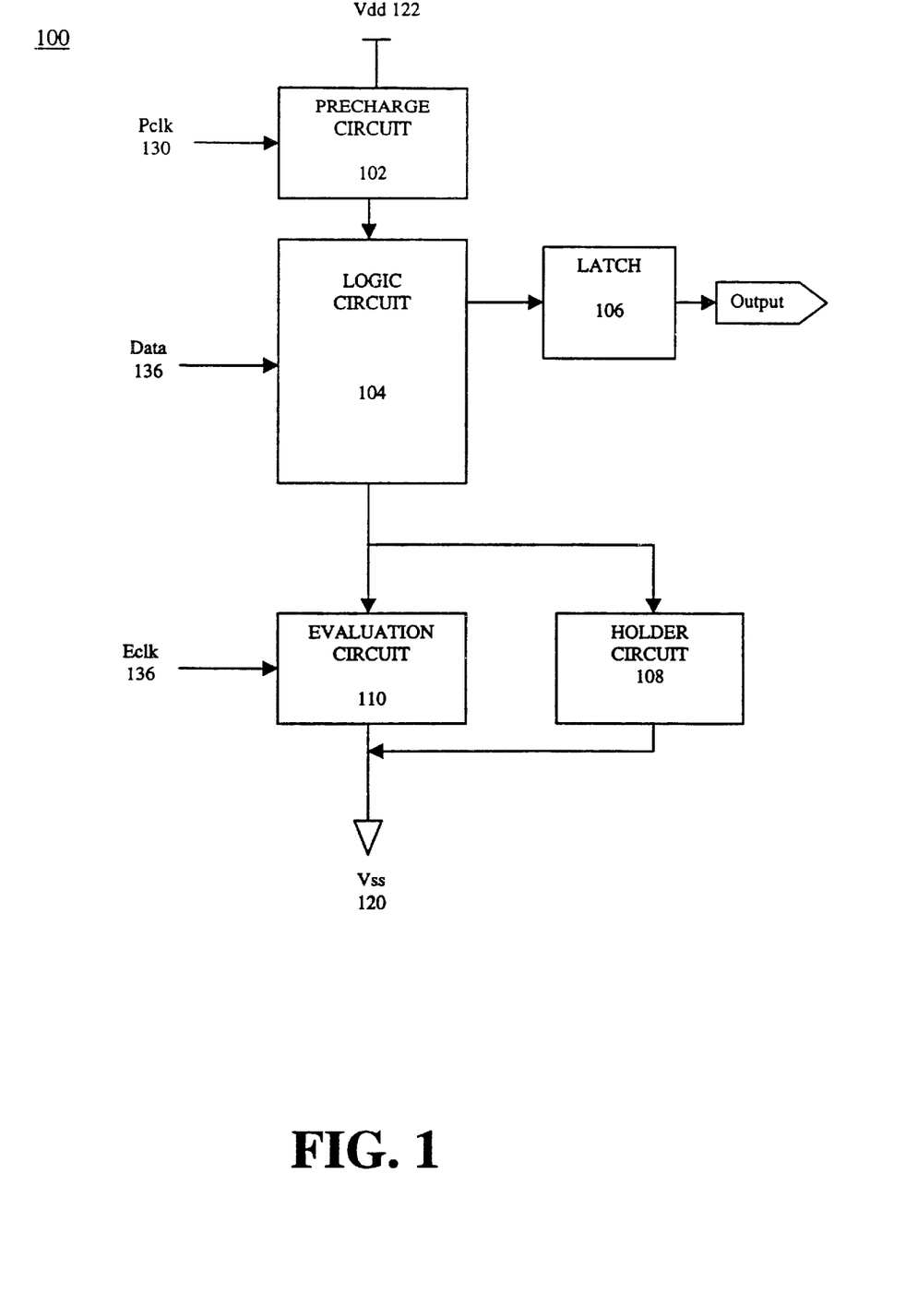
FIG. 1 is a block diagram of a storage device illustrating one embodiment of the domino circuit with a holder circuit.

FIG. 1 illustrates a domino circuit 100 including a precharge circuit 102, a logic circuit 104, a latch 106, a holder circuit 108, and an evaluation circuit 110. Precharge circuit 102 is coupled to logic circuit 104, a power supply Vdd 122, and a precharge clock ("Pclk") 130. Various PMOS (p-channel metal-oxide semiconductor) and/or NMOS (n-channel metal-oxide semiconductor) transistors may be used in precharge circuit 102. For one embodiment, precharge circuit 102 uses a PMOS transistor to perform a precharge function if Pclk 130 is negative enable. Negative enable refers to a device that operates at the logic state 0. It should be appreciated that precharge circuit 102 may receive additional control signals.

For one embodiment, precharge circuit 102 charges predetermined nodes in logic circuit 104 to a predefined voltage potential in response to a precharge cycle. The duration of the precharge cycle is controlled by Pclk 130. A node is a connecting point where multiple wires can be coupled.

Logic circuit 104 is coupled to latch 106, precharge circuit 102, and evaluation circuit 110. Latch 106 stores output information, such as the output value. Precharge circuit 102 precharges various nodes in logic circuit 104 during the precharge cycle. For one embodiment, logic circuit 104 receives at least one input signal or input data and is able to perform logic functions, such as a multiplexer/and/nor/ exclusive-OR/latch functions. For one embodiment, logical functions like multiplexer/and/nor/exclusive-OR/latch functions are built in to a register.

In operation, logic circuit 104 performs a logic function, such as a multiplexing/latch or an exclusive-OR/latch functions, during the evaluation cycle. The multiplexing/ latch function is able to perform a logic selection (or multiplex) followed by a latch (or a store) function. The function of exclusive-OR/latch is a logic exclusive-OR function followed by a latch function.

Evaluation circuit 110 is coupled to logic circuit 104, holder circuit 108, and a power supply VSS 120. In one embodiment, Vss 120, also known as Vgnd, supplies ground or low voltage potential. Eclk 136, also known as the Evaluation clock signal, is used to signal the duration of the evaluation cycle. For one embodiment, evaluation circuit 206 includes various PMOS and/or NMOS transistors to produce evaluation cycles. Note that the evaluation circuit 110 may also receive other signals.

Holder circuit 108 is coupled to logic circuit 104 and evaluation circuit 110. For one embodiment, holder circuit 108 is used to limit one latch or one store in logic circuit 104 for a given evaluation cycle. For an alternative embodiment, holder circuit 108 prevents a node, which stores a logic value, to become float. As discussed previously, a float or float node has a tendency to inadvertently flip its logic state because the voltage potential at the float node is not being driven. Consequently, use of holder circuit 108, which holds the initial latched value at a node, enhances not only the speed, but also the reliability, such as increasing noise tolerance, of a domino circuit.

Figure 2:
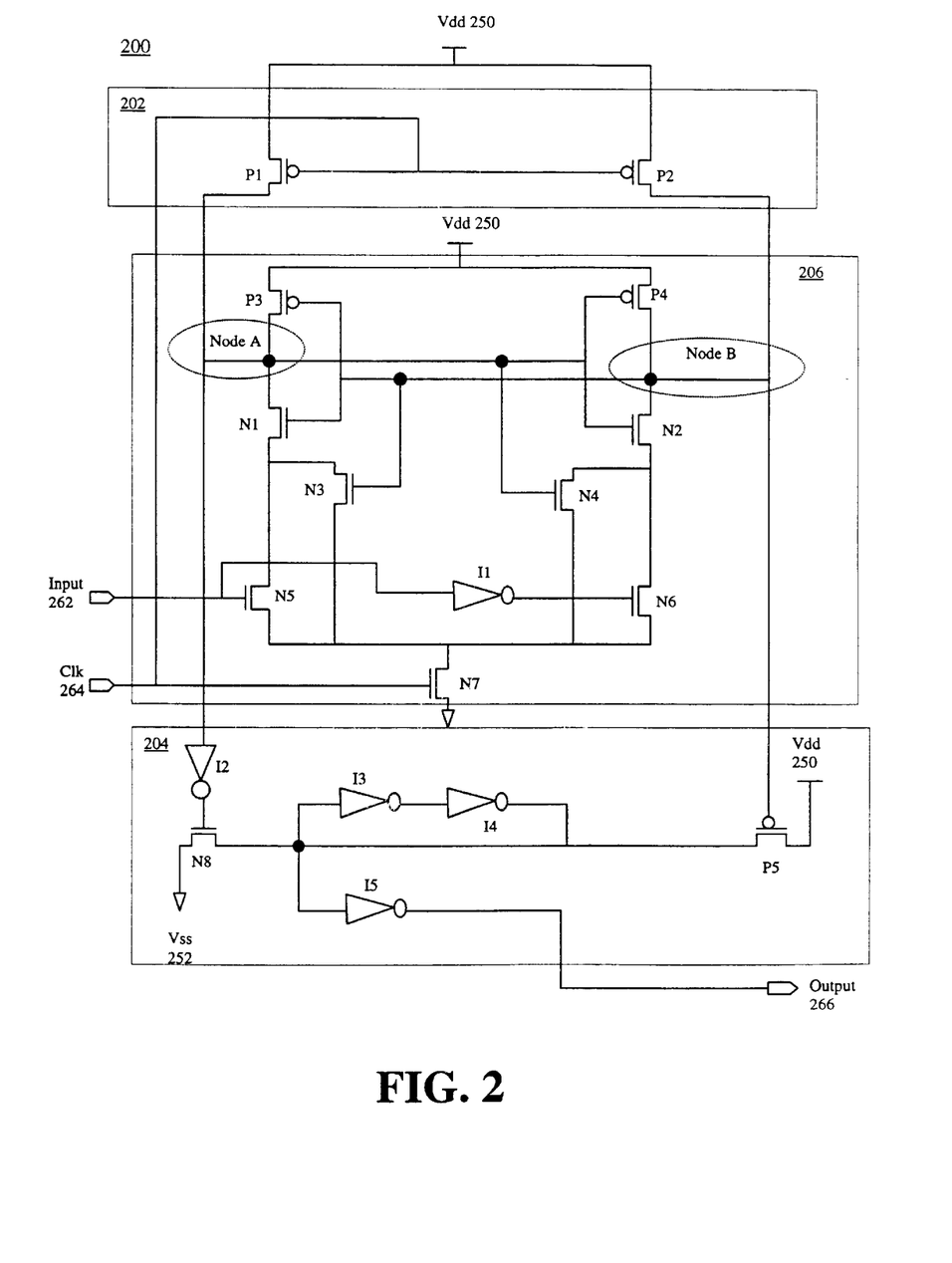
FIG. 2 illustrates a storage device including a holder circuit.

FIG. 2 illustrates a device 200 including precharge circuit 202, a logic circuit 206, and an evaluation circuit 204. Precharge circuit 202 contains two P-type transistors, P1 and P2. When dock signal CLK 264 is low, precharge circuit 202 recharges node A and B in logic circuit 206.

For one embodiment, logic circuit 206 contains a storage component, a input component, and a holder component. For this embodiment, the storage component includes two P-type transistors, P3–4 and two N-type transistors, N1–2. Node A is situated between P3 and N1. Node B is situated between P4 and N2. Node A and B, also known as complimentary nodes, are capable of storing logic states. For one embodiment, the complimentary nodes store opposite logic states.

The input component includes two N-type transistors N5–6 and an inverter I1. The input component receives at least one input signal or input data. For one embodiment, the input data determines the latched value at node A and B during the evaluation cycle.

The holder component includes two N-type transistors N3–4, which establish at least one conducting path to perform the holding function. For one embodiment, the holder component prevents the change of the logic states stored at node A and node B as a result of changing of the input data during the evaluation cycle. Once the logic states at node A and B are set at the beginning stage of the evaluation cycle, the holder component holds the logic states at node A and B until the next precharge cycle regardless of the value of input data.

In operation, when CLK264 is low, it turns off transistor N7 and precharges node A and B. After precharge cycle and CLK 264 becomes high, precharge circuit 202 stops precharging and the logic value at the node A and B are subsequently set or determined according to input data 262. The output value at output 266 is determined according to the logic values stored at node A and B. For example, when CLK 264 is high, the output 266 would be high if the input data 262 is high. Similarly, the output 266 would be low if the input data 262 is low.

For one embodiment, evaluation circuit 204 includes 4 inverters I2–5, a P-type transistor P5, and an N-type transistor N8. For this embodiment, I2, N8, and P5 are used to set a logic value at the output or output node 266. I3–4 are used to retain the logic value at the output 266 once the value is set.

Figure 3:
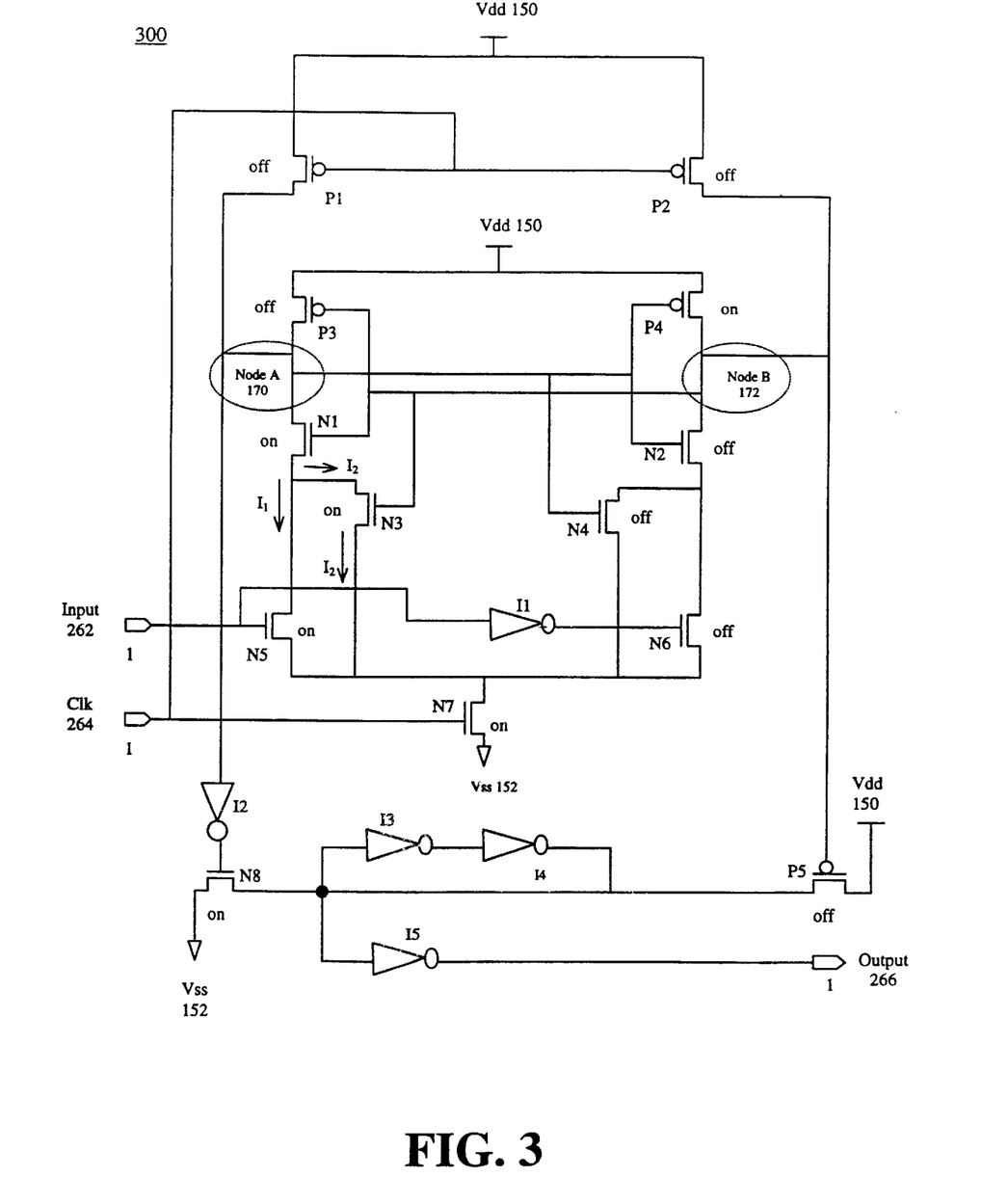
FIG. 3 illustrates an exemplary storage device according to one embodiment of the invention.

FIG. 3 is an example of the device 300 in accordance to one embodiment of the invention. When CLK 264 is high, which indicates an evaluation cycle, it turns off transistors P1–2 and turns on transistor N7. Because input 262 is high or logic 1 state, it turns on transistor N5 and turns off transistor N6. Once N5 is on, it pulls down the voltage potential at node A. When the voltage potential at node A goes to logic 0 state, it also turns on P4 and turns off N2. Because N2 and N6 is off and P4 is on, the high voltage potential at node B is maintained. Since P5 is turned off by node B and N8 is turned on by node A, output 266 outputs a logic 1 state.

Input data 262, however, may change its logic value from 1 to 0 after the initial setting but before the end of the evaluation cycle. After input data. 262 is changed to 0 or logic 0 state, it will turn off N5 and turn on N6. For one embodiment, the holder component, which includes N3–4, will hold the original logic values at node A and B until the next precharge cycle. An intended purpose of using the holder component is to prevent the latched data (at node A and B) becoming unstable during the evaluation cycle.

Because node B maintains a logic high value, it keeps N3 of the holder component to be on. When N3 is on, it will continue to maintain node A to be logic 0 state. If node A continues to be low, it will maintain P4 to be on and N2 to be off. For one embodiment, N3 and N4 establish two conducting passes for node A and B. Therefore, even though the input data 262 has changed its logic state after the initial setting of the values at the storage nodes, device 300 maintains or holds its original values throughout the evaluation cycle.

Figure 4:
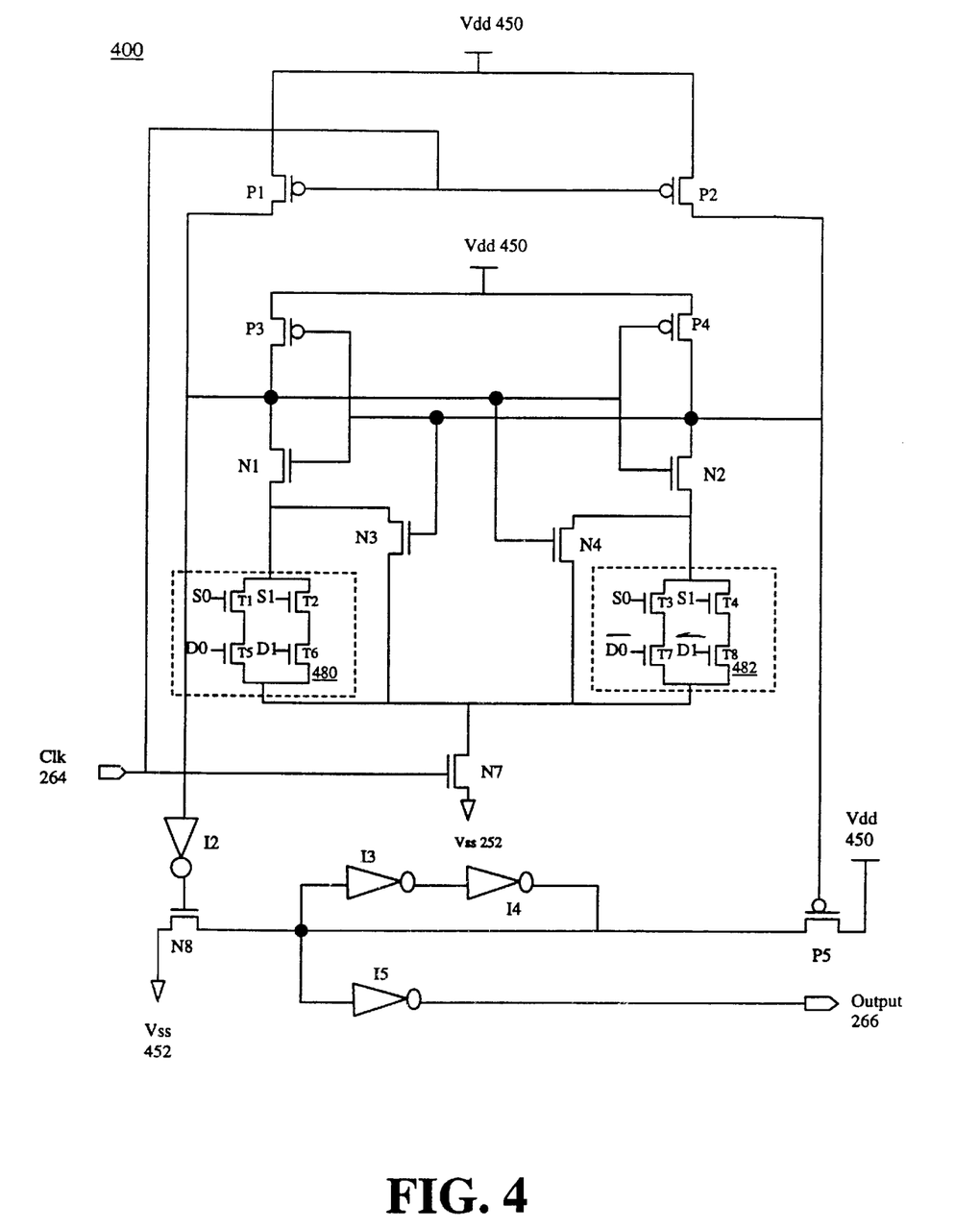
FIG. 4 illustrates a storage device having multiple inputs.

FIG. 4 illustrates a device 400 having multiple inputs. Referring to FIG. 4, device 400 is similar to device 300 illustrated in FIG. 3 except the input component. For one embodiment, the input component includes two portions 480–482, in which each portion contains four n-type transistors.

For this embodiment, device 400 is able to perform a multiplexing function followed by a latch function during the evaluation cycle. Transistors T1–4 are driven or controlled by S0–1 and transistor T5–8 are controlled by D0–1. S0–1 are selecting signals while D0–1 are input data. For this embodiment, S0 selects D0 while S1 selects D1. It should be apparent to one skilled in the art that input components 480–482 can be replaced with any other logical functions as long as they can be performed within the evaluation cycle.

Figure 5:
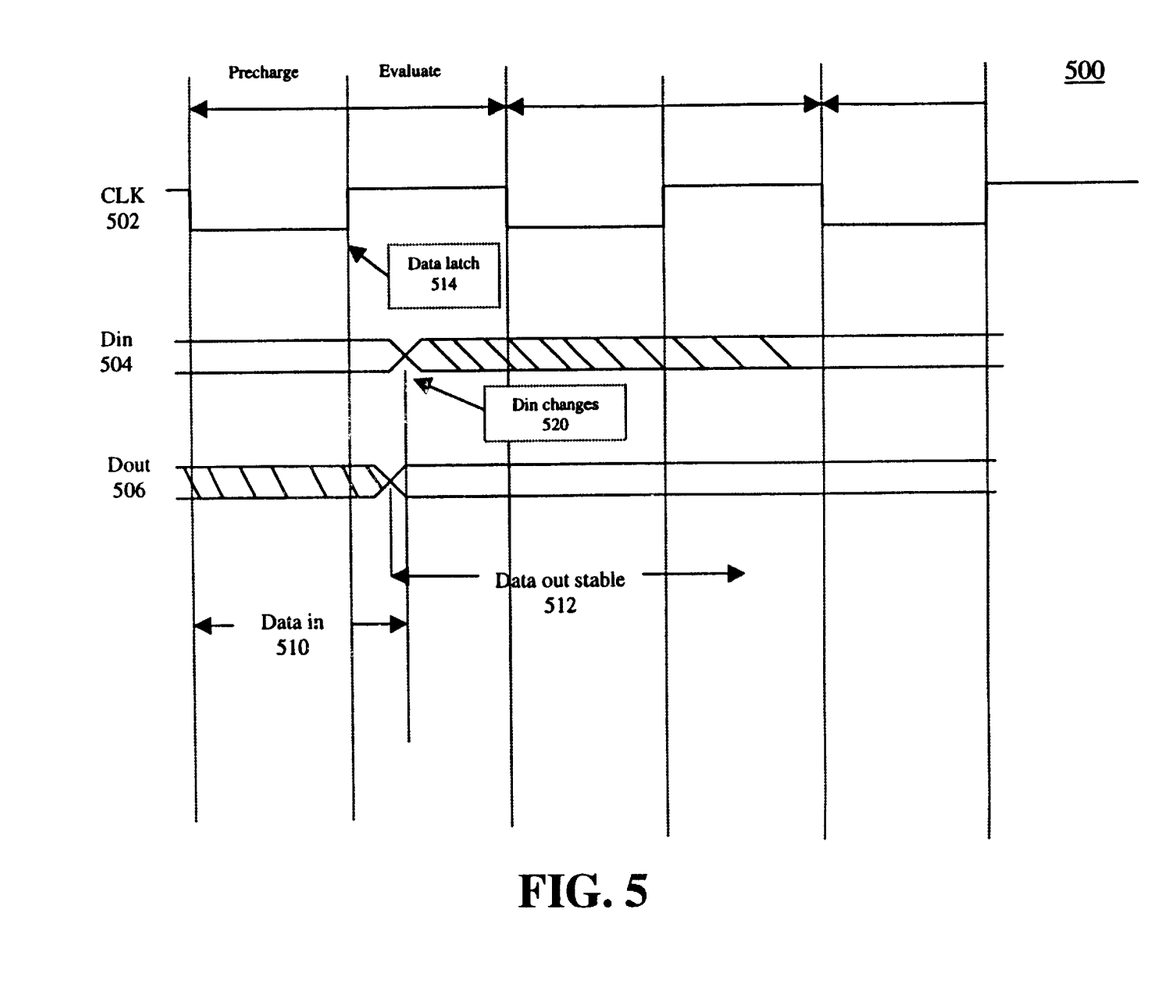
FIG. 5 illustrates a timing diagram according to one embodiment of the invention.

FIG. 5 illustrates a timing diagram 500 according to one embodiment of the invention. Diagram 500 includes a clock signal, CLK 502, an input signal, Din 504, and an output signal, Dout 506. For one embodiment, when Din 502 changes its logic value after the initial latch setting but before the end of the evaluation cycle, Dout 506 will remain stable throughout the evaluation cycle. Note that if the hold component or circuit is not used in the device, Dout 506 may become unstable during the evaluation cycle after the logic value of Din 504 changes.

Figure 6:
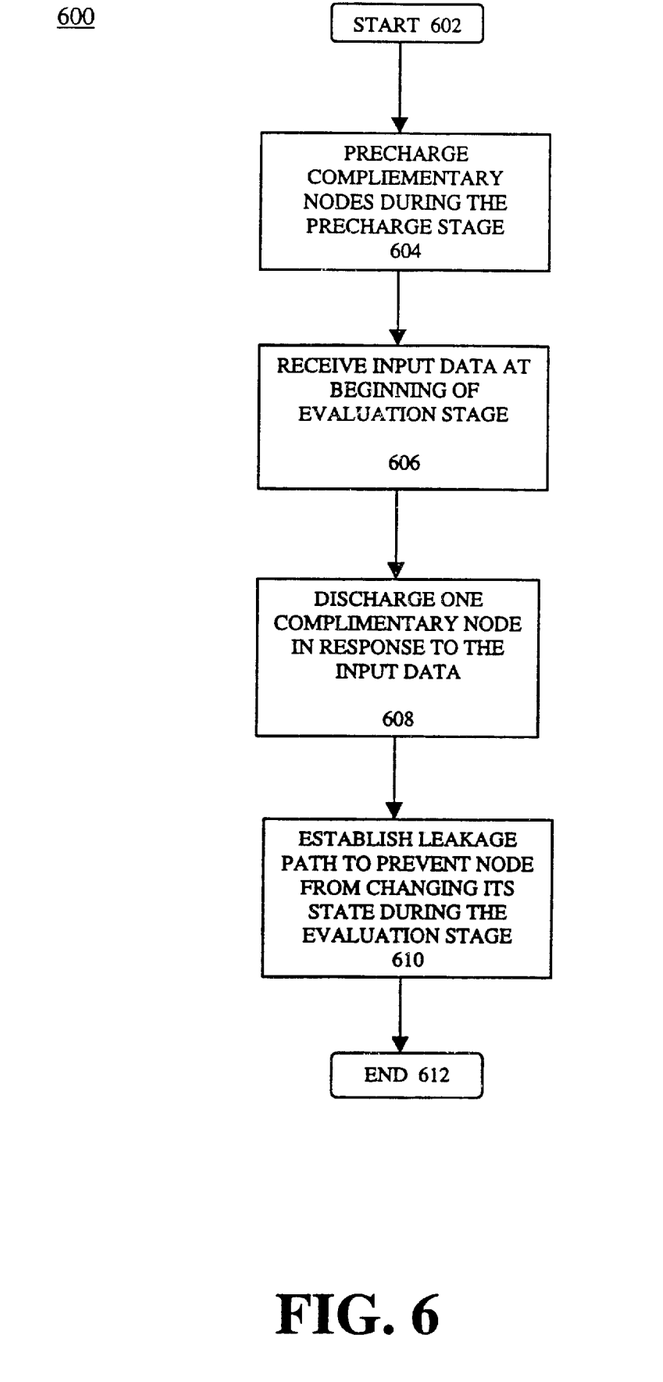
FIG. 6 is a flowchart illustrating a process of implementing the storage device according to one embodiment of the invention.

FIG. 6 is a flowchart 600 illustrating a process of implementing the device in accordance to one embodiment of the invention. At block 604, the precharge circuit precharges the complimentary nodes to the precharge voltage potential during the precharge stage, or cycle.

At block 606, the device receives input data at the beginning of the evaluation cycle. For one embodiment, the input data includes multiple input signals for performing various logic functions, such as a multiplexing function followed by a latch function.

At block 608, one of the complimentary nodes is discharged in response to the input data. Upon completion of the discharge process, the storage nodes, such as node A and B, are set to a specific logic states in response to the input data.

At block 610, after the voltage potentials are set at the storage nodes, conducting passes of the holder component is established. The conducting passes, which consists of multiple transistors, is used to limit to set storage nodes once for each evaluation stage. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

We claim:

1. A method for maintaining logic state stored in a storage device comprising:
   precharging at least two complimentary nodes in said storage device during a precharge stage;
   holding an output value of said storage device during said precharge stage;
   receiving an input data during an evaluation stage;
   storing a logic state in said storage device in response to said input data; and
   providing at least one conductive path to limit one store per each said evaluation stage.

2. The method of claim 1, further comprising discharging at least one complimentary node in response to said input data.

3. The method of claim 1, further comprising receiving a singlephase dock with 50 percent duty cycle.

4. The method of claim 1, wherein said precharging at least two complimentary nodes further includes receiving a precharge clock, wherein said precharge clock is a phase clock indicating duration of said precharge stage.

5. The method of claim 1, wherein said receiving input data further includes receiving an evaluation signal indicating duration of said evaluation stage.

6. The method of claim 1, wherein said storing a logic state includes reading said input data at the rising edge of said evaluating signal.

7. The method of claim 1, wherein said providing at least one conducting path includes maintaining logic states stored at said complimentary nodes.

8. The method of claim 1, wherein said providing at least one conducting path further includes preventing said complimentary nodes from inadvertent discharge.

9. A method for maintaining logic state stored in a storage device comprising:
   precharging at least two complimentary nodes in said storage device during a precharge stage;
   receiving an input data during an evaluation stage;
   ignoring said input data when output data is stabilized during said evaluation stage;
   storing a logic state in said storage device in response to said input data; and
   providing at least one conductive path to limit one store per each said evaluation stage.

10. The method of claim 1, wherein said providing at least one conducting path further includes utilizing said logic state stored in said complimentary nodes to control said conducting path.

11. A device for performing edge trigger register comprising:
   a storage cell containing a plurality of complimentary nodes;
   a precharge circuit coupled to said storage cell for precharging at least one pair of said complimentary nodes;
   an output holder coupled to said storage cell for storing an output value;
   an input circuit coupled to said storage cell for setting up logic states at said complimentary nodes in response to said input data; and
   circuit coupled to said storage cell providing additional discharge channels to limit one latch at said complimentary nodes per each evaluation stage, wherein said storage includes a logic function.

12. The device of claim 11, further comprising an evaluating circuit coupled to said storage cell.

13. The device of claim 11, wherein said precharge circuit is controlled by a single-phase dock with 50 percent by 50 percent duty cycle.

14. The device of claim 11, wherein said storage cell is a register.

15. The device of claim 11, wherein said discharge circuit is controlled by logic states stored in said storage cell.

16. The device of claim 11, wherein said discharge circuit contains two transistors.

17. The device of claim 16, wherein said transistors are N-type transistors.

18. The device of claim 16, wherein said transistor are P-type transistors.

19. The device of claim 11, wherein said discharge circuit provides additional conducting channels to maintain logic states stored in said storage cell.

20. The device of claim 11, wherein said discharge circuit turns off said conducting channels during said precharge stage.

21. A device for performing edge trigger register comprising:
   a storage cell containing a plurality of complimentary nodes;
   a precharge circuit coupled to said storage cell for precharging at least one pair of said complimentary nodes;
   an input circuit coupled to said storage cell for setting up logic states at said complimentary nodes in response to said input data;
   circuit coupled to said storage cell providing additional discharge channels to limit one latch at said complimentary nodes per each evaluation stage, wherein said storage includes a logic function; and wherein said discharge circuit causes said input data to be ignored when logic states are latched in said complimentary nodes during said evaluation stage.

22. An apparatus for maintaining logic state stored in a storage device comprising:

means for precharging at least two complimentary nodes during a precharge stage;

means for holding an output value in a storage device during said precharge stage;

means for receiving input data during an evaluation stage;

means for storing a logic state at said complimentary nodes in response to said input data; and means for providing at least one conductive path to one store per each said evaluation stage.

23. The apparatus of claim 22, further comprising means for discharging at least one complimentary node in response to said input data.

24. The apparatus of claim 22, further comprising means for receiving a single-phase clock with 50 percent by 50 percent duty cycle.

25. The apparatus of claim 22, wherein said means for precharging at least two complimentary nodes further includes means for receiving a precharge clock, wherein said precharge clock is a phase clock indicating duration of said precharge stage.

26. The apparatus of claim 22, wherein said means for receiving input data further includes means for receiving an evaluation signal indicating duration of said evaluation stage.

27. The apparatus of claim 22, wherein said means for storing a logic state includes means for reading said input data at the rising edge of said evaluating signal.

28. The apparatus of claim 22, wherein said means for providing at least one conducting path includes means for maintaining logic states of said complimentary nodes.

29. The apparatus of claim 22, wherein said means for providing at least one conducting path further includes means for preventing said complimentary nodes from inadvertent discharge.

30. An apparatus for maintaining logic state stored in a storage device comprising:

means for precharging at least two complimentary nodes during a precharge stage;

means for receiving input data during an evaluation stage;

means for storing a logic state at said complimentary nodes in response to said input data;

means for providing at least one conductive path to one store per each said evaluation stage; and means for causing said input data to be ignored when logic states are latched at said complimentary nodes during said evaluation stage.

31. The apparatus of claim 22, wherein said means for providing at least one conducting path further includes means for utilizing said logic state stored at said complimentary nodes to control said conducting path.

* * * * *